(12) United States Patent
Yoon et al.

(10) Patent No.: US 8,304,772 B2
(45) Date of Patent: Nov. 6, 2012

(54) THIN-FILM TRANSISTOR ARRAY PANEL AND METHOD OF FABRICATING THE SAME

(75) Inventors: Yeo-Geon Yoon, Seoul (KR); Myung-Koo Hur, Cheonan-si (KR); Sang-Gun Choi, Asan-si (KR); Joo-Han Kim, Yongin-si (KR); Cheol-Gon Lee, Cheonan-si (KR); Jung-Suk Bang, Guri-si (KR)

(73) Assignee: Samsung Display Co., Ltd. (KR)

( * ) Notice: Subject to any disclaimer, the term of this patent is extended or adjusted under 35 U.S.C. 154(b) by 197 days.

(21) Appl. No.: 12/620,102

(22) Filed: Nov. 17, 2009

(65) Prior Publication Data
US 2010/0264417 A1    Oct. 21, 2010

(30) Foreign Application Priority Data

Apr. 21, 2009   (KR) .................. 10-2009-0034703

(51) Int. Cl.
*H01L 29/04* (2006.01)
(52) U.S. Cl. .............. 257/59; 257/72; 257/258
(58) Field of Classification Search .......... 257/59, 257/72, 258
See application file for complete search history.

(56) References Cited

U.S. PATENT DOCUMENTS

| | | | |
|---|---|---|---|
| 5,414,283 A | 5/1995 | den Boer et al. | |
| 5,847,413 A | 12/1998 | Yamazaki et al. | |
| 6,671,010 B2 | 12/2003 | Kwon et al. | |
| 6,794,682 B2 * | 9/2004 | Watanabe et al. | 257/72 |
| 6,891,236 B1 * | 5/2005 | Yamazaki | 257/410 |
| 7,038,278 B2 | 5/2006 | Tsujimura et al. | |
| 7,268,839 B2 | 9/2007 | Cho et al. | |
| 2004/0036072 A1 * | 2/2004 | Tsujimura et al. | 257/72 |
| 2006/0279685 A1 * | 12/2006 | Hirakata et al. | 349/141 |
| 2007/0020910 A1 * | 1/2007 | Park et al. | 438/612 |
| 2010/0002172 A1 * | 1/2010 | Kim et al. | 349/106 |

FOREIGN PATENT DOCUMENTS

| | | |
|---|---|---|
| KR | 20010082831 A | 8/2001 |
| KR | 20050006340 A | 1/2005 |
| KR | 100720428 B1 | 5/2007 |
| KR | 100731037 B1 | 6/2007 |
| KR | 1020080008550 A | 1/2008 |

* cited by examiner

*Primary Examiner* — Tan N Tran
(74) *Attorney, Agent, or Firm* — Innovation Counsel LLP

(57) ABSTRACT

A thin-film transistor array panel and a manufacturing method thereof are provided for one or more embodiments. The thin-film transistor array panel may include: a substrate; a gate electrode formed on the substrate; a gate insulating layer formed on the gate electrode; a source electrode and a drain electrode formed on the gate insulating layer; and a flatness layer formed on the source electrode and the drain electrode, wherein the drain electrode has a higher height than the flatness layer.

11 Claims, 17 Drawing Sheets ized by Korean Patent Application No. 10-2009-0034703 filed in the
Korean Intellectual Property Office on Apr. 21, 2009, the
entire contents of which are incorporated herein by reference.

THIN-FILM TRANSISTOR ARRAY PANEL AND METHOD OF FABRICATING THE SAME

CROSS-REFERENCE TO RELATED APPLICATIONS

This application claims priority to and the benefit of Korean Patent Application No. 10-2009-0034703 filed in the Korean Intellectual Property Office on Apr. 21, 2009, the entire contents of which are incorporated herein by reference.

BACKGROUND

1. Technical Field

The present disclosure relates to a thin-film transistor array panel and a manufacturing method thereof. More particularly, the present disclosure relates to a thin-film transistor array panel and a manufacturing method thereof for minimizing a change of parasitic capacitance and ensuring high luminance by improving the aperture ratio of pixels.

2. Description of the Related Art

A liquid crystal display (LCD) is one of the most commonly used flat panel displays, and it includes two substrates with electrodes formed thereon and a liquid crystal layer interposed between the two substrates. In the LCD, a voltage is applied to the electrodes to realign liquid crystal molecules of the liquid crystal layer, to thereby regulate the transmittance of light passing through the liquid crystal layer.

A thin-film transistor array panel is one of at least two panels of the liquid crystal display. The thin-film transistor array panel includes a scanning signal line or a gate line transmitting a scanning signal, an image signal line or a data line transmitting an image signal, a thin-film transistor connected to the gate line and data line, and a pixel electrode connected to the thin-film transistor of each pixel.

In the thin-film transistor array panel, parasitic capacitances are generated between the gate electrode and the source electrode (Cgs), and between the gate electrode and the drain electrode (Cgd). The magnitude of these parasitic capacitances depends on the size of the overlapping area between the gate electrode and the source electrode, for Cgs, and the size of the overlapping area between the gate electrode and the drain electrode, for Cgd. Therefore, if the area of a drain electrode is increased, the aperture ratio deteriorates and the parasitic capacitance increases. As a result, a kick-back voltage may be increased, with the consequent image deterioration of the liquid crystal display.

As a result, a thin-film transistor array panel and a method of manufacturing thereof is needed such that the area of a drain electrode and the area of a source electrode may be reduced, which may minimize parasitic capacitance effects and enhance the aperture ratio and the luminance of an LCD panel.

SUMMARY

An exemplary embodiment of the present invention provides a thin-film transistor array panel for suppressing an increase of parasitic capacitance between a drain electrode and a gate electrode, and improving the aperture ratio thereof.

An exemplary embodiment of the present invention also provides a manufacturing method of a thin-film transistor array panel for suppressing an increase of parasitic capacitance between a drain electrode and a gate electrode, and improving the aperture ratio thereof.

Alternative embodiments of the present invention are not limited to the above-mentioned embodiments. Other embodiments will be apparent to those skilled in the art from the following description.

The thin-film transistor array panel, according to an exemplary embodiment of the present invention, includes: a substrate; a gate electrode formed on the substrate; a gate insulating layer formed on the gate electrode; a source electrode and a drain electrode formed on the gate insulating layer. The thin-film transistor array may also include a flatness layer formed on the source electrode and the drain electrode, wherein the drain electrode has a higher height than the flatness layer.

A manufacturing method of a thin-film transistor array panel, according to an exemplary embodiment of the present invention, includes: providing a substrate; forming a gate electrode on the substrate forming a gate insulating layer on the gate electrode; forming a source electrode and a drain electrode on the gate-insulating layer forming a flatness layer on the source electrode and the drain electrode. The manufacturing method of a thin-film transistor may also include forming a contact hole in the flatness layer, wherein the drain electrode of the region of the contact hole is higher than the flatness layer.

A manufacturing method of a thin-film transistor array panel, according to another exemplary embodiment of the present invention, includes: providing a substrate; forming a gate electrode on the substrate; forming a gate-insulating layer on the gate electrode; forming a source electrode and a drain electrode on the gate-insulating layer; forming a photoresist pattern on the source electrode and the drain electrode; etching back the photoresist pattern to remove the photoresist pattern on the source electrode; etching the source electrode to reduce the height of the source electrode; stripping the photoresist pattern; forming a flatness layer on the source electrode and the drain electrode; and etching the flatness layer for the drain electrode to have a higher height than the flatness layer.

A manufacturing method of a thin-film transistor array panel, according to another exemplary embodiment of the present invention, includes: providing a substrate; forming a gate electrode on the substrate; forming a gate insulating layer on the gate electrode; forming a source electrode and a drain electrode on the gate-insulating layer, and a lifting layer between the source electrode and the drain electrode; forming a photoresist pattern on the source electrode and the drain electrode; etching back the photoresist pattern to remove the photoresist pattern on the source electrode; etching the lifting layer to remove a portion of the source electrode on the lifting layer; stripping the photoresist pattern; forming a flatness layer on the source electrode and the drain electrode; and etching the flatness layer for the drain electrode to have a higher height than the flatness layer.

DETAILED DESCRIPTION

Figure 1:
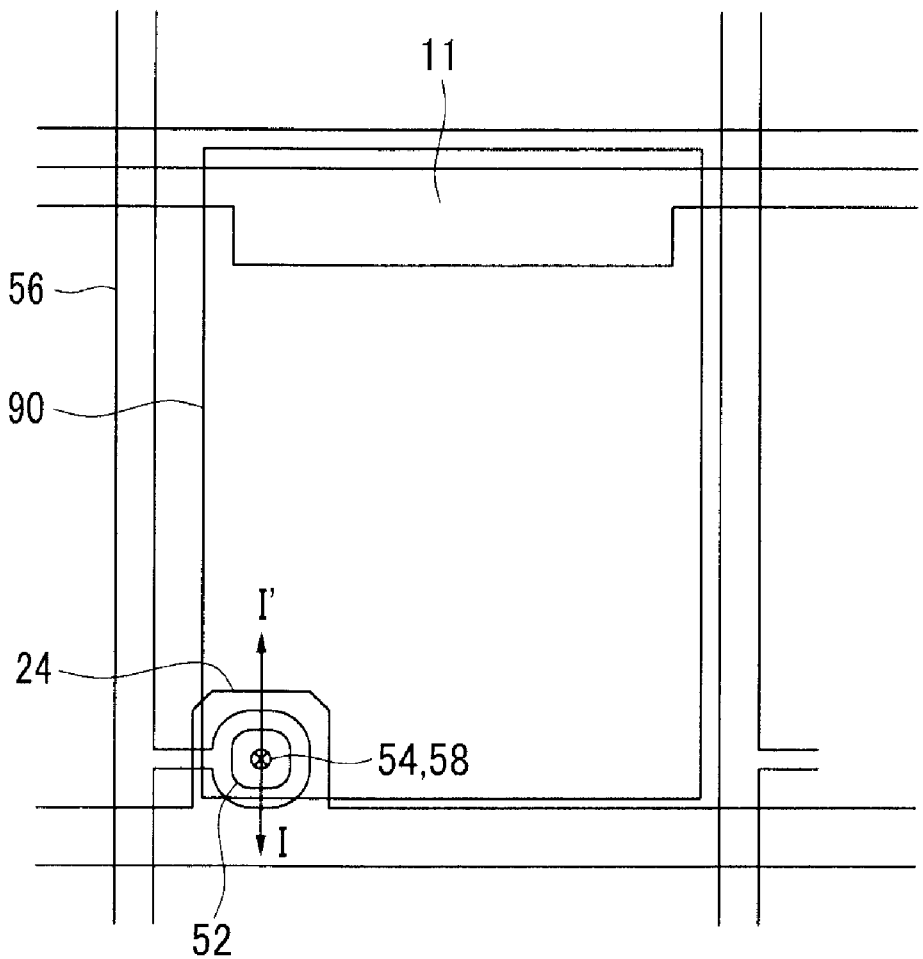
FIG. 1 is a top plan view of a thin-film transistor array panel according to a first exemplary embodiment of the present invention.

The advantages, features and aspects of embodiments of the invention will become apparent from the following description of the embodiments with reference to the accompanying drawings, which is set forth hereinafter. However, the present invention is not limited to exemplary embodiments that are described herein. The present invention may have various embodiments. The exemplary embodiments are provided to clearly show the present invention to those skilled in the art, and the present invention is intended to cover various modifications and equivalent arrangements included within the spirit and scope of the appended claims. Accordingly, in various exemplary embodiments, well-known processes, well-known elements, and well-known techniques are not explained in detail to avoid ambiguous interpretation of the present invention. Like reference numerals, designate like elements throughout the specification.

Spatially comparative terms such as "below", "beneath", "lower", "above", and "upper" may be used to describe one element, constituent elements, and other elements, or the relationship between constituent elements as shown in accompanying drawings. Spatially comparative terms should be understood as terms including orientations of an element other than the orientations shown in accompanying drawings. For example, when the drawn elements are turned over, the element described as "below" or "beneath" the other elements may be disposed "above" the other elements. Accordingly, the exemplary terms "below" or "beneath" may refer to upper and lower directions. The elements may be aligned in different directions such that the spatially comparative terms may be interpreted according to the alignment.

In the following description, technical terms are used only to explain a specific exemplary embodiment while not limiting the present invention. Terms in a singular form may include plural forms, unless referred to the contrary. The meaning of "include" specifies a property, a region, a fixed number, a step, a process, an element, and/or a component, but does not exclude other properties, regions, fixed numbers, steps, processes, elements, and/or components.

Although not specifically defined, all of the terms including the technical and scientific terms used herein have a meaning understood by ordinary persons skilled in the art. The terms have a specific meaning corresponding to related technical references and the present specification, as well as a lexical meaning. That is, the terms are not construed as ideal or having a formal meaning.

In the present specification, for convenience of explanation, a thin-film transistor array panel including a non-patterned pixel electrode and a pixel electrode that is not divided into sub-pixel electrodes will be described, for example. However, the thin-film transistor array panel that may be applied with the technical concepts of embodiments of the present invention is not limited thereto. Rather, embodiments of the present invention may be applied to a thin-film transistor array panel having patterned vertical alignment (PVA) in which one pixel area has a plurality of domain division portions, or including a pixel electrode that is patterned into minute electrodes.

Figure 2:
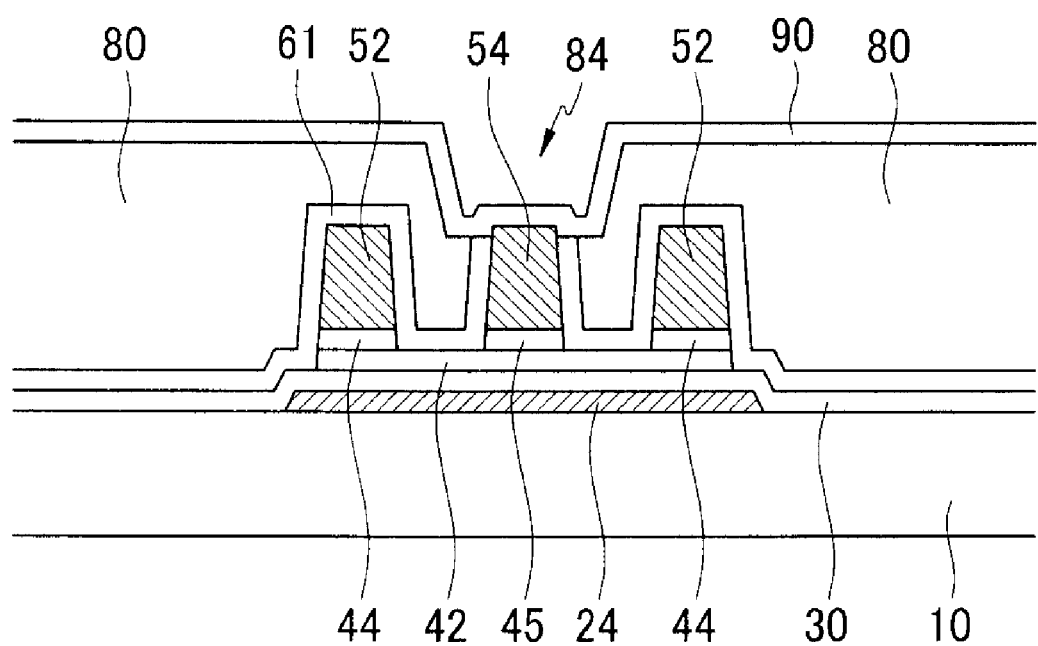
FIG. 2 is a cross-sectional view of the thin-film transistor array panel according to the first exemplary embodiment of the present invention taken along the line I-I' of FIG. 1.

Next, a thin-film transistor array panel according to the first exemplary embodiment of the present invention will be described with reference to FIG. 1 and FIG. 2. FIG. 1 is a top plan view of a thin-film transistor array panel according to the first exemplary embodiment of the present invention. FIG. 2 is a cross-sectional view of the thin-film transistor array panel according to the first exemplary embodiment of the present invention taken along the line I-I' of FIG. 1.

A thin-film transistor array panel includes various elements such as a thin-film transistor formed on an insulation substrate 10 made of glass such as soda lime glass or borosilicate glass, or made of plastic.

A gate wire 22 and 24 transmitting a gate signal is formed on the insulation substrate 10. The gate wire 22 and 24 includes a gate line 22 extending in one direction, for example a transversal direction in FIG. 1, and a gate electrode 24 of a thin-film transistor that is branched from the gate line 22 as a protrusion. In the present exemplary embodiment, one gate line 22 is disposed for one unit pixel area, however two gate lines 22 may be disposed for one unit pixel area, thereby applying the gate signal to different sub-pixels. In this case, two gate electrodes 24 may be disposed in a pixel with neighboring data lines 56 on both sides of the pixel.

In the present exemplary embodiment, the pixel area may be a closed region defined by the crossing of the gate line 22 and the data line 56.

Also, a storage line 11 transmitting a common voltage may be formed on the insulation substrate 10. The storage line 11 may be formed substantially parallel to the gate line 22, in a transversal direction according to FIG. 1.

The gate wire 22 and 24, and the storage line 11 may be made of an aluminum-based metal, e.g. aluminum (Al) or aluminum alloys, a silver-based metal e.g. silver (Ag) or silver alloys, a copper-based metal e.g. copper (Cu) or copper alloys, or a molybdenum-based metal, e.g. molybdenum (Mo) or molybdenum alloys. Other metals that can be used include chromium (Cr), tantalum (Ta) and titanium (Ti). In some embodiments of the present invention, gate wire 22 and 24, and the storage line 11 may have a multi-layered structure including two or more conductive films (not shown) having different physical characteristics. One of the conductive layers may be formed using a metal having low resistivity, such as an aluminum-based metal, a silver-based metal, or a copper-based metal, in order to reduce signal delay or voltage drop. A second conductive layer may be formed using a material having good physical, chemical, and electrical contact characteristics, particularly with transparent conductive electrodes formed of materials such as zinc oxide (ZnO), indium tin oxide (ITO), and indium zinc oxide (IZO). In some embodiments of the present invention, a second conductive layer may be formed of materials such as a molybdenum-based metal, chromium, tantalum, titanium, or the like. Preferred examples of the combination may include a lower chromium film and an upper aluminum (alloy) film, and a lower aluminum (alloy) film and an upper molybdenum (alloy) film. However, embodiments of the present invention are not limited thereto, and the gate wire 22 and 24 and the storage line 11 may be made of various metals or conductors.

A gate insulating layer 30 made of silicon oxide (SiOx) or silicon nitride (SiNx) is formed on the insulation substrate 10, the gate wire 22 and 24, and the storage line.

A semiconductor layer 42 made of hydrogenated amorphous silicon or polysilicon is formed on the gate-insulating layer 30. The semiconductor layer 42 may have various shapes such as an island shape or a linear shape, and has the island shape in the present exemplary embodiment. The semiconductor layer 42 overlaps the gate electrode 24.

Ohmic contact layers 44 and 45 made of a material such as n+ hydrogenated amorphous silicon in which an n-type impurity such as phosphor is doped with a high density, or are made of silicide, are formed on the semiconductor layer 42. The ohmic contact layers are disposed on the semiconductor layer 42.

A data wire 52, 54, and 56 is formed on the ohmic contact layer 44 and 45 and the gate-insulating layer 30.

The data wire 52, 54, and 56 includes the data line 56, a source electrode 52 branched from the data line 56, and a drain electrode 54 separated therefrom and having an island shape, according to the plan view shown in FIG. 1.

The data line 56 is extended in a longitudinal direction thereby intersecting the gate line 22 and a storage line, and transmits a data voltage. The gate line 22 and the data line 56 intersect, thereby defining the pixel area.

The data line 56 includes the source electrode 52 that is branched toward the drain electrode 54. In addition, the data line 56 may include an end portion (not shown) for receiving the data signal from a different layer or an external circuit to transmit a signal to the data line 56.

Preferably, the data wire 52, 54, and 56 may be made of a metal such as copper. In other embodiments, the data wire 52, 54 and 56 may be made of a refractory metal, such as a molybdenum-containing metal, chromium, tantalum, and titanium, or their alloys, and can have a multi-layer structure including a lower layer (not shown) of the refractory metal film (not shown) and an upper layer of a low-resistance conductive layer (not shown). Examples of the multi-layer structure can include a double-layer of a chromium lower film and an aluminum (alloy) upper film, or an aluminum lower layer and a molybdenum upper layer, and a triple-layer of a molybdenum (alloy) lower film, an aluminum (alloy) intermediate layer, and a molybdenum (alloy) upper film.

At least a portion of the source electrode 52 overlaps the semiconductor layer 42. The drain electrode 54 faces the source electrode 52 and at least a portion thereof overlaps the semiconductor layer 42.

Here, the above-described ohmic contact layers 44 and 45 are only disposed between the underlying semiconductor layer 42 and the overlying source electrode 52 and drain electrode 54, thereby reducing contact resistance therebetween.

A passivation layer 61 is formed in the region of the source electrode 52 and the drain electrode 54 on the semiconductor layer 42. The passivation layer 61 may be made of an inorganic material such as silicon nitride (SiNx) or silicon oxide (SiOx). The passivation layer 61 protects the exposed semiconductor layer 42.

A color filter of red (R), green (G), or blue (B) may be formed in the pixel area that is defined by the intersection of the gate line 22 and the data line 56. The color filter passes light of a specific wavelength range. Each color filter may be disposed with a stripe shape, a mosaic shape, or a delta shape. The color filter may be made of a photosensitive organic material, for example a photoresist. The color filters may be formed with the same thickness, or may have a predetermined step. The color filter may be made of a red color organic material passing the light of a red wavelength, a blue color organic material passing the light of a blue wavelength, or a green color organic material passing the light of a green wavelength.

A flatness layer 80 is formed on the source electrode 52, the drain electrode 54, and the passivation layer 61. The flatness layer 80 may be made of an organic photoresist material having an excellent flatness characteristic. The flatness layer 80 has a thickness of about 3 μm that is sufficient to cover the passivation layer 61.

The flatness layer 80 has a contact hole 84. The drain electrode 54 is connected to a pixel electrode 90 that will be described later, through the contact hole 84. Accordingly, the data signal may be applied to the pixel electrode 90 through the data line 56. The pixel electrode 90 may be made of a transparent conductor such as indium tin oxide (ITO) or indium zinc oxide (IZO), or a reflective conductor such as aluminum.

The drain electrode 54 of the present invention has a higher height than the flatness layer 80. Accordingly, the drain electrode 54 is protruded on the flatness layer 8, and the pixel electrode 90 can be directly contacted thereto. As above described, if the pixel electrode 90 is directly contacted with the drain electrode 54, the connection of the pixel electrode 90 and the drain electrode 54 is sufficient even if the area of the drain electrode is not wide like the conventional art. Accordingly, the parasitic capacitance is decreased and the kickback voltage is decreased, thereby improving image quality. At least one of the transverse length or the longitudinal length of the drain electrode 54 may be in the range of 2-16 μm (cf. plan view of FIG. 1).

Next, a column spacer (not shown) may be formed on the thin-film transistor array panel. The column spacer maintains a cell gap between an upper panel and the thin-film transistor array panel facing thereto.

Next, a manufacturing method of the thin-film transistor array panel according to the first exemplary embodiment of the present invention will be described with reference to FIG. 1 to FIG. 12. FIG. 3 to FIG. 12 are cross-sectional views sequentially showing a manufacturing method of the thin-film transistor array panel according to the first exemplary embodiment of the present invention.

Figure 3:
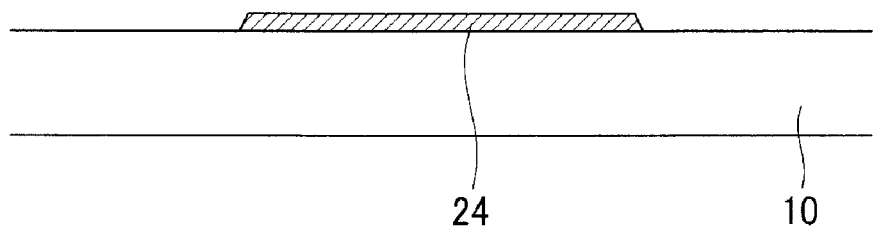
FIG. 3 to FIG. 12 are cross-sectional views sequentially showing a manufacturing method of the thin-film transistor array panel according to the first exemplary embodiment of the present invention.

Firstly, referring to FIG. 1 and FIG. 3, a gate wire 22 and 24 is formed on an insulation substrate 10.

A sputtering method may be used to form the gate wire 22 and 24. When patterning the gate wire 22 and 24, wet etching or dry etching may be used. In the wet etching, an etchant of phosphoric acid, nitric acid, or acetic acid may be used. In addition, in the dry etching, an etching gas of the chlorine group such as $Cl_2$, $BCl_3$ may be used.

Figure 4:
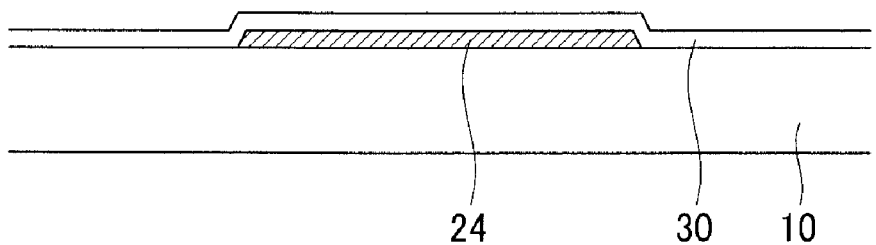

Next, referring to FIG. 4, a gate-insulating layer 30 is formed on the insulation substrate 10 and the gate wire 22 and 24. The gate-insulating layer 30 may be formed through plasma-enhanced chemical vapor deposition (PECVD) or reactivity sputtering.

Figure 5:
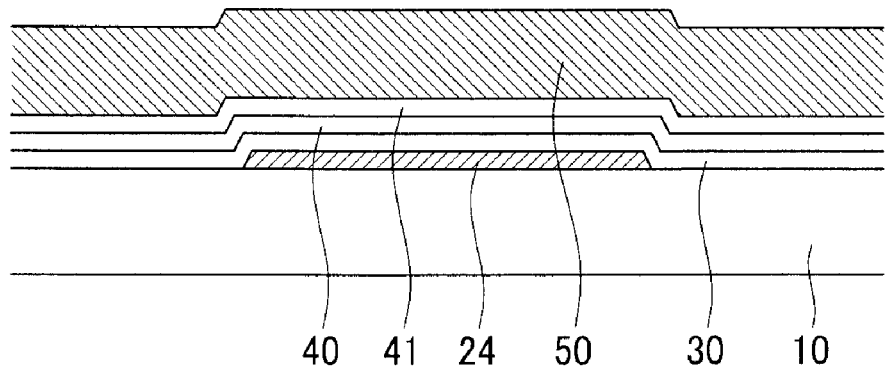

Next, referring to FIG. 5, a hydrogenated amorphous silicon layer 40, an n+ hydrogenated amorphous silicon layer 41, doped with an n-type impurity at a high concentration, and a conductive layer 50 of a conductive material for a data wire are sequentially deposited on the gate insulating layer 30. Here, the hydrogenated amorphous silicon layer 40 and the n+ hydrogenated amorphous silicon layer 41 may be formed through plasma-enhanced chemical vapor deposition or chemical vapor deposition. The conductive layer 50 may be formed through sputtering, electroplating, or electro-less plating. Here, when etching a flatness layer that will be described later, it is necessary to control the height of the remaining amount of the flatness layer near the contact hole. This height needs to be sufficiently less than the height of the drain electrode, and the drain electrode needs to be higher than the flatness layer. Therefore, it is preferable that the conductive layer be made thick. The thickness of the conductive layer 50 may be changed according to whether the height of the remaining amount of the flatness layer near the contact hole is controlled to the same degree after etching the flatness layer, and how the flatness layer is uniformly controlled. Generally, the thickness of the conductive layer 50 may be about 1 μm, or may be more than 1 μm.

Figure 6:
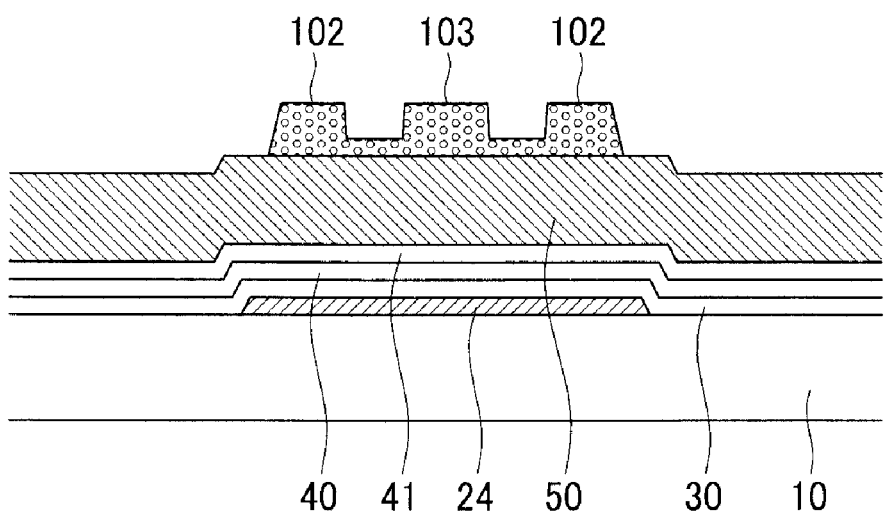

Next, referring to FIG. 6, a photoresist is coated on the conductive layer 50, and is exposed and developed to form a photoresist pattern to pattern the hydrogenated amorphous silicon layer 40, the n+ hydrogenated amorphous silicon layer 41, and the conductive layer 50.

Figure 7:
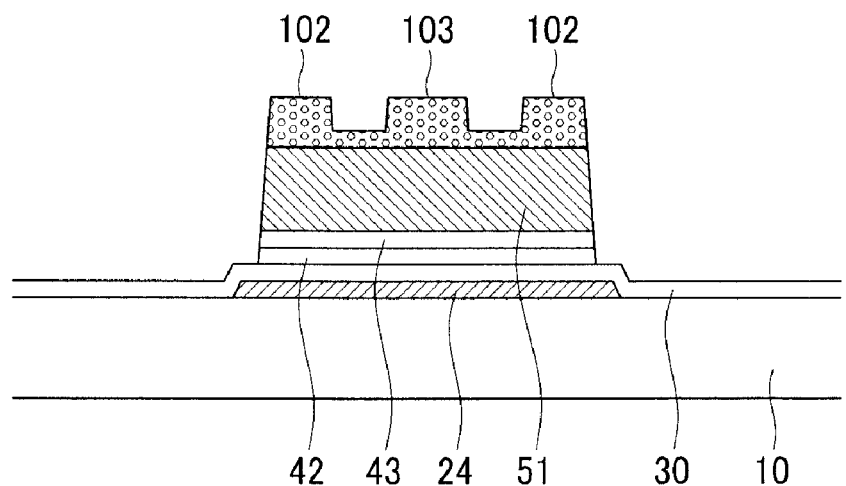

Next, referring to FIG. 7, the hydrogenated amorphous silicon layer 40, the n+ hydrogenated amorphous silicon layer 41, and the conductive layer 50 are etched by using the photoresist pattern as a mask to form a semiconductor layer 42, an ohmic contact layer pattern 43, and a conductive layer pattern 51.

Figure 8:
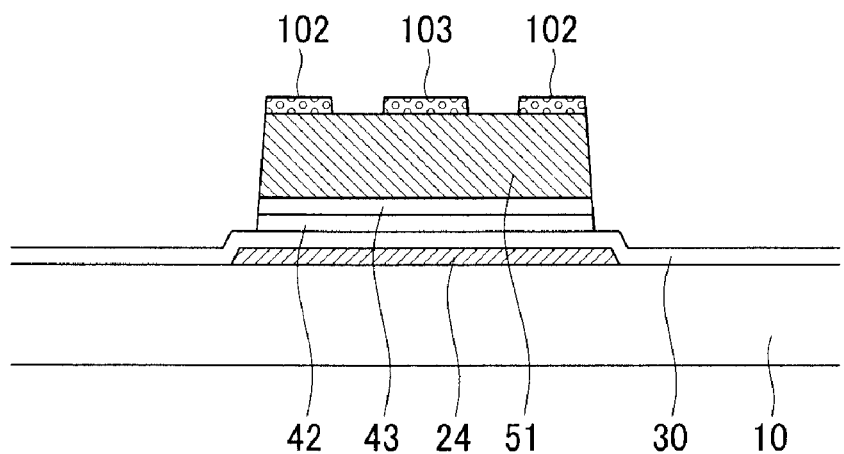

Next, referring to FIG. 8, photoresist patterns 102 and 103 are formed on the conductive layer pattern 51 to etch the ohmic contact layer pattern 43 and the conductive layer pattern 51. The photoresist pattern 102 is used to form a source electrode 52 from the conductive layer pattern 51, and the photoresist pattern 103 is used to form the drain electrode 54.

Figure 9:
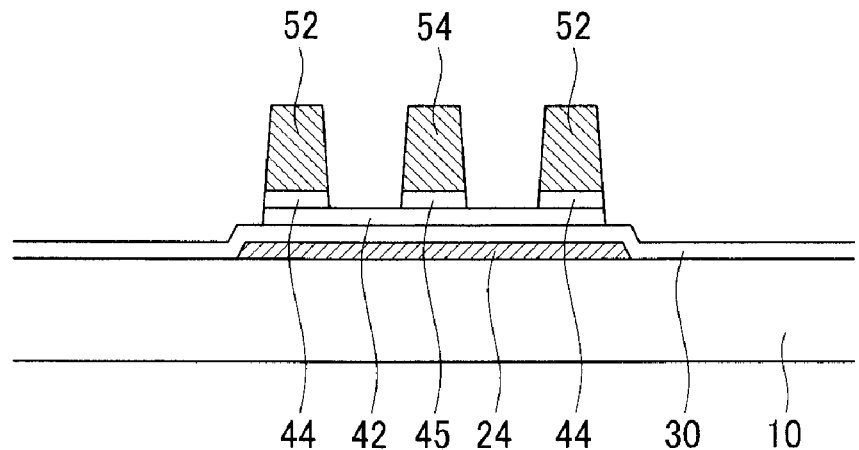

Next, referring to FIG. 9, the conductive layer pattern 51 is patterned by using the photoresist patterns 102 and 103 as etching masks to form the source electrode 52 and the drain electrode 54. Here, the ohmic contact layer pattern 43 is simultaneously patterned to form ohmic contact layers 44 and 45 respectively overlapping under the source electrode 52 and the drain electrode 54. The source electrode 52 is patterned with a shape enclosing the drain electrode 54. In addition, at least one of the transverse length and the longitudinal length of the drain electrode 54 may be in the range of 2-16 μm, and more preferably 2-4 μm (cf. plan view of FIG. 1). In addition, the length of the channel between the source electrode 52 and the drain electrode 54 may be in the range of 2-10 μm.

Figure 10:
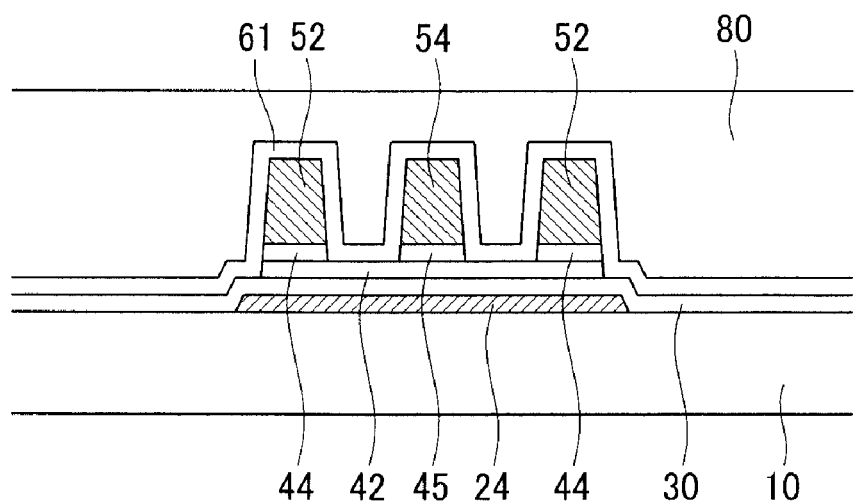

Next, referring to FIG. 10, an insulating material is deposited on the resulting object of FIG. 9 through plasma-enhanced chemical vapor deposition or chemical vapor deposition, to form a passivation layer 61. Here, the insulating material used may be silicon oxide (SiO2) or silicon nitride (SiNx). In addition, a flatness layer 80 is formed on the source electrode 52, the drain electrode 54, and the passivation layer 61. Here, the flatness layer 80 may be made of an organic material for their excellent flatness characteristic. Further, a color filter may be formed on the passivation layer 61 shown in FIG. 10.

Figure 11:
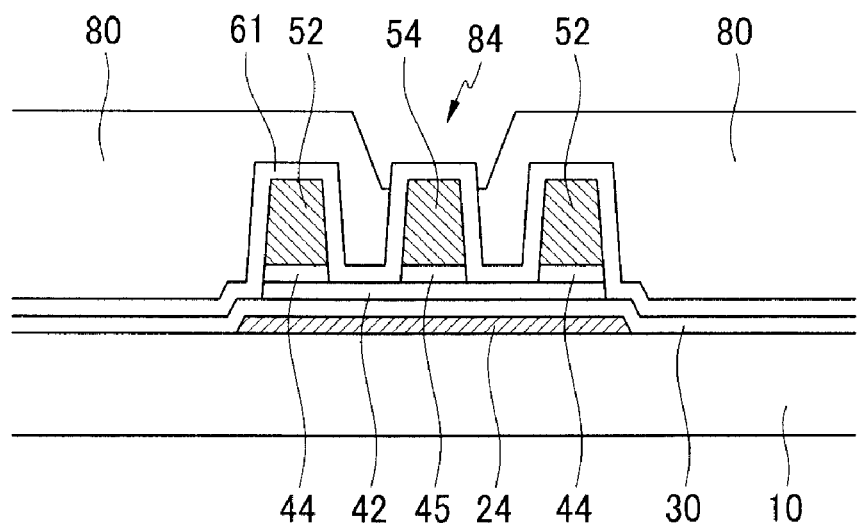
Figure 12:
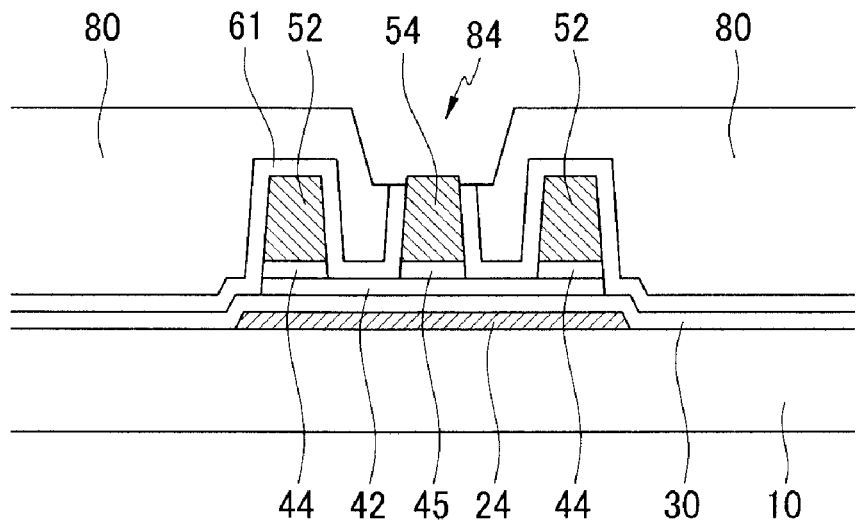

Next, referring to FIG. 11 and FIG. 12, the flatness layer 80 of FIG. 10 is etched and the passivation layer 61 is etched to form a contact hole 84. The etching of the flatness layer 80 may use a partial exposure method. The partial exposure method may be a half-tone exposure or a slit exposure method. When forming the contact hole 84, the drain electrode 54 has a higher (greater) height than the flatness layer 80 remaining in the region of the contact hole. This region structure of the contact hole 84 may be formed by etching the flatness layer 80 with less height than the drain electrode 54 when etching the flatness layer 80. If it is difficult for the height of the flatness layer 80 that remains in the region of the contact hole to be controlled, or if the drain electrode 54 is thickly formed, then when etching the flatness layer 80, the height of the flatness layer 80 that remains in the region of the contact hole 84 may be increased. Furthermore, the remaining flatness layer 80 in the region of the contact hole 84 may be etched back to a lesser height than the height of the drain electrode 54 after forming the contact hole 84.

Again referring to FIG. 2, a transparent conductive material such as ITO or IZO is deposited on the flatness layer through sputtering. The transparent conductive material is patterned to form a pixel electrode 90 connected to the drain electrode 54 through the contact hole 84.

Figure 13:
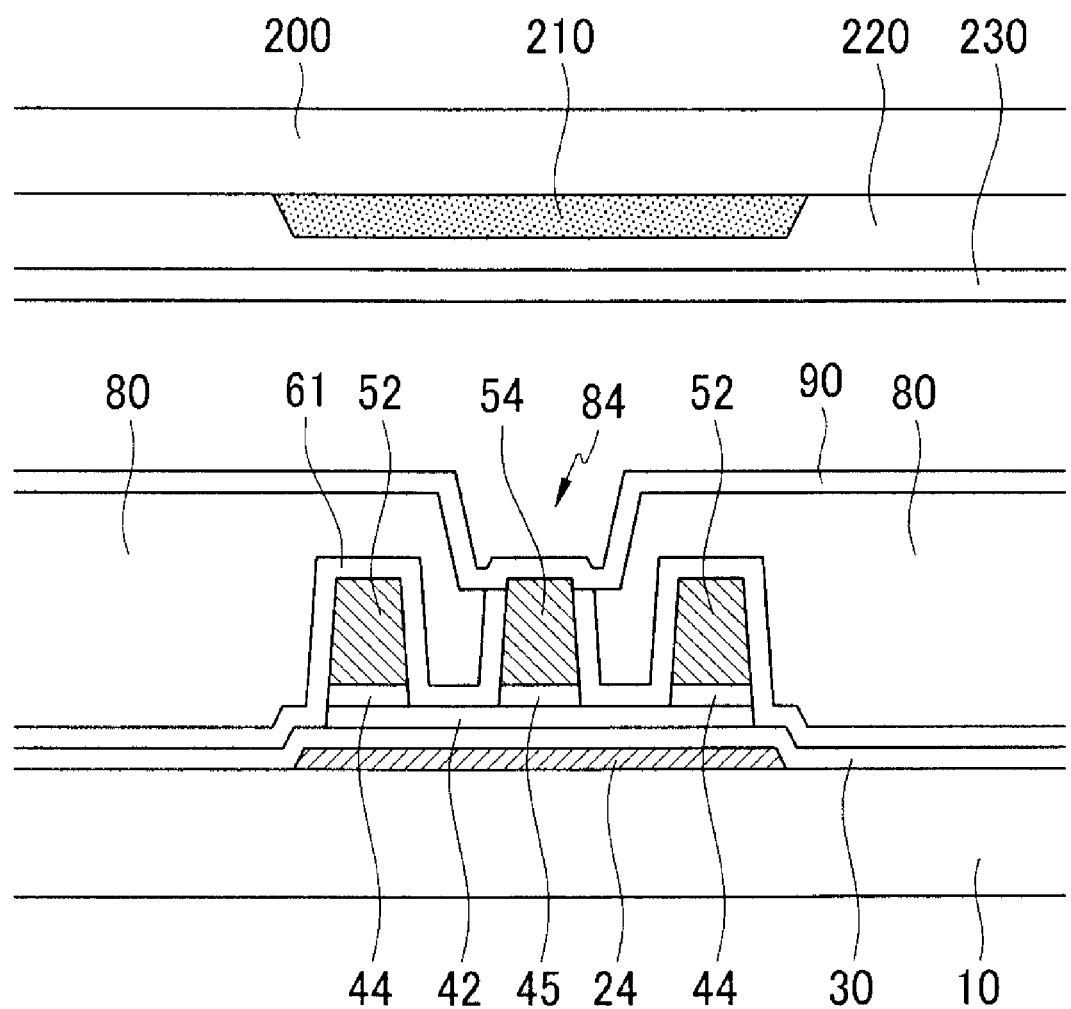
FIG. 13 is a cross-sectional view exemplary showing a relationship of the thin-film transistor array panel according to the first exemplary embodiment, and an upper panel corresponding thereto.

FIG. 13 is a cross-sectional view of an exemplary liquid crystal display showing a relationship of the thin-film transistor array panel, according to the first exemplary embodiment shown in FIG. 1, and an upper panel corresponding thereto. Referring to FIG. 13, the upper panel includes a base substrate 200, a black matrix 210, an overcoat 220, and a common electrode 230.

The black matrix 210 may be made of a metal (a metal oxide) such as chromium (Cr), chromium oxide, or an organic black resist. On the other hand, the black matrix 210 may overlap the thin-film transistor of the thin-film transistor array panel. Accordingly, light leakage is prevented, thereby improving the image quality. On the other hand, according to an embodiment of the present invention, the contact hole 84 is disposed on a region overlapping the black matrix of the upper panel such that the aperture ratio may be increased, thereby improving the image quality.

Next, a manufacturing method of a thin-film transistor array panel according to a second exemplary embodiment of the present invention will be described with reference to FIG. 14 to FIG. 23. For convenience of explanation, in the second exemplary embodiment, members having the same function as members shown in the drawings of the first exemplary embodiment are indicated by the same reference numerals, and descriptions thereof are omitted or simplified.

Figure 14:
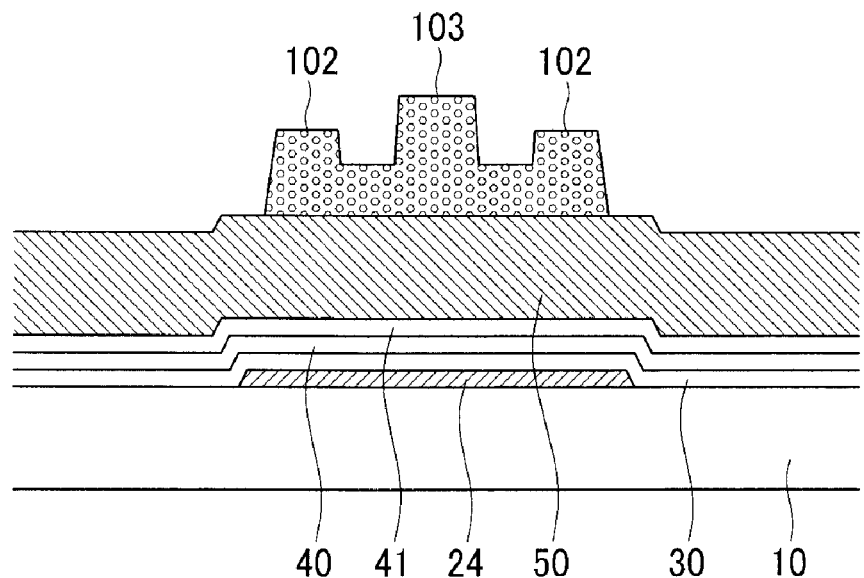
FIG. 14 to FIG. 23 are cross-sectional views sequentially showing a manufacturing method of a thin-film transistor array panel according to a second exemplary embodiment of the present invention.

Referring to FIG. 14, hydrogenated amorphous silicon layer 40, n+ hydrogenated amorphous silicon layer 41, and conductive layer 50 for the data wire are sequentially formed on the gate-insulating layer 30. A photoresist is coated on the conductive layer 50. The photoresist is developed to form a photoresist pattern for etching the hydrogenated amorphous silicon layer 40, the n+ hydrogenated amorphous silicon layer 41, and the conductive layer 50. The resulting object shown in FIG. 14 except for the step structure of the photoresist pattern is formed with substantially the same method as in the first exemplary embodiment. The photoresist pattern of FIG. 14 includes a first portion corresponding to a region where the drain electrode is formed, a second portion corresponding to a region where the conductive layer and the ohmic contact layer are etched, and a third portion corresponding to a region where the source electrode is formed. The first portion is highest and the third portion is lowest.

Figure 15:
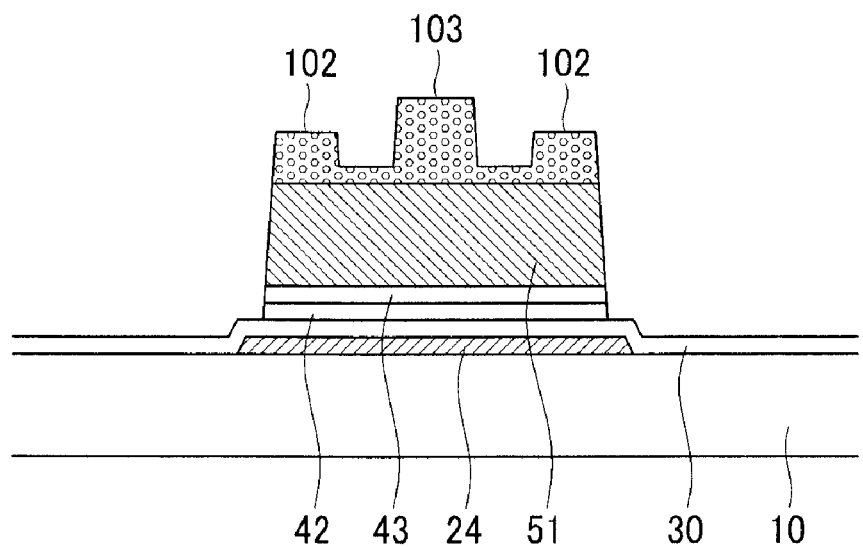
Figure 16:
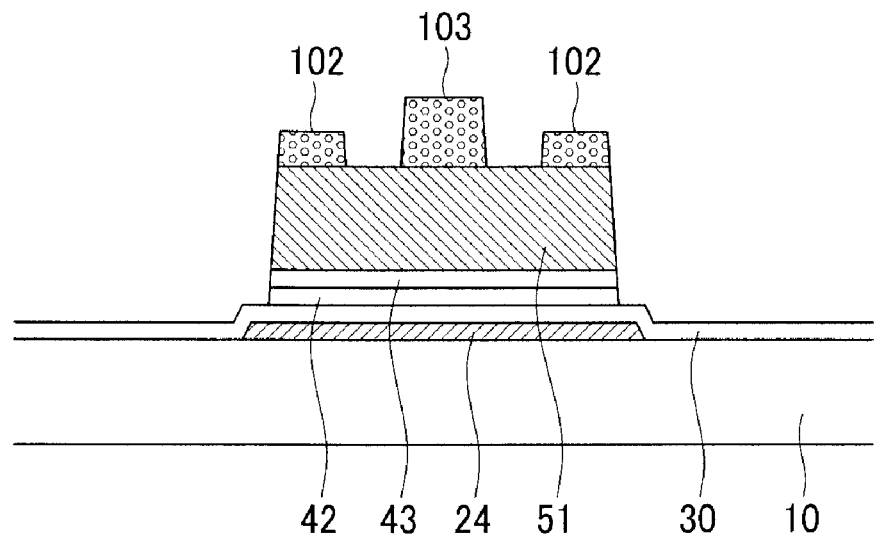
Figure 17:
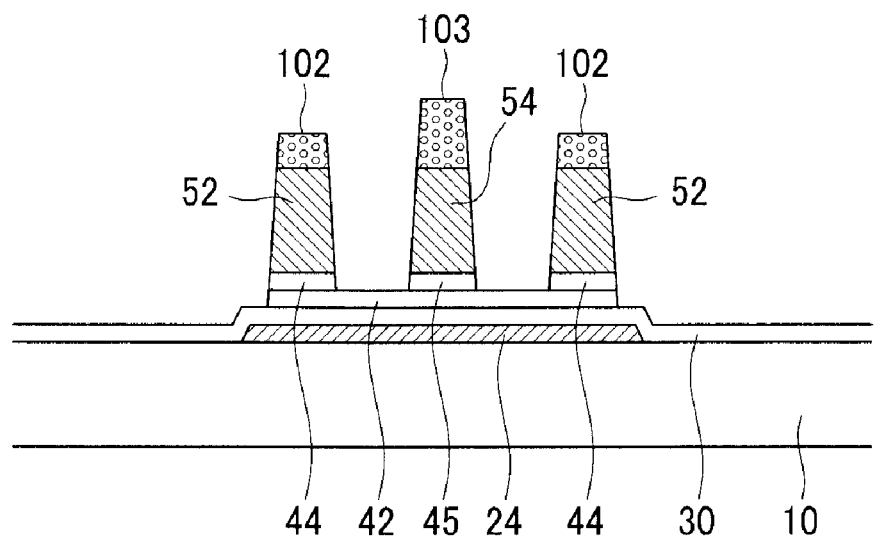

Next, the manufacturing process of FIG. 15, FIG. 16, and FIG. 17 may be executed by substantially the same method as in the first exemplary embodiment. In detail, after forming the semiconductor layer 42, the ohmic contact layer pattern 43, and the conductive layer pattern 51, photoresist patterns 102 and 103 are formed on the conductive layer pattern 51. The conductive layer pattern 51 is patterned by using the photoresist patterns 102 and 103 as etching mask to form source electrode 52 and drain electrode 54. The source electrode 52 is formed with a shape enclosing the drain electrode 54 (cf. plan view of FIG. 1). In addition, at least one of the transverse length and the longitudinal length of the drain electrode 54 may be in the range of 2-16 μm, and preferably 2-4 μm (cf.

plan view of FIG. 1). In addition, the channel length between the source electrode 52 and the drain electrode 54 may be in the range of 2-10 μm.

Figure 18:
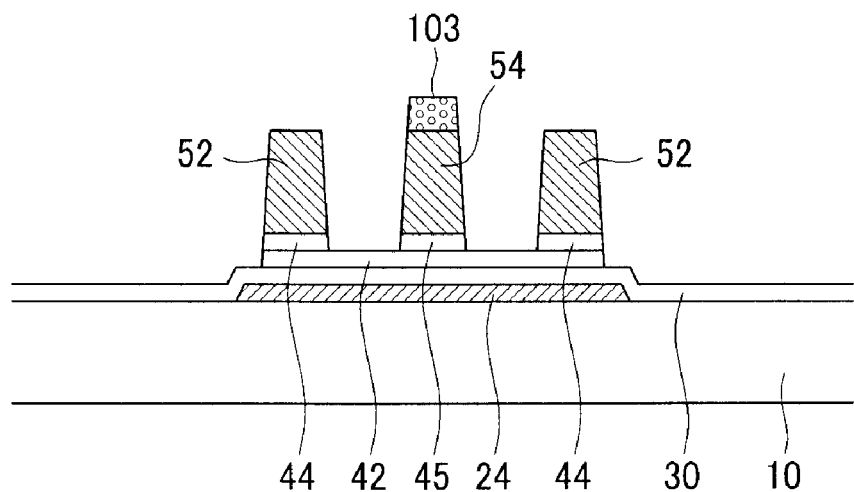
Figure 19:
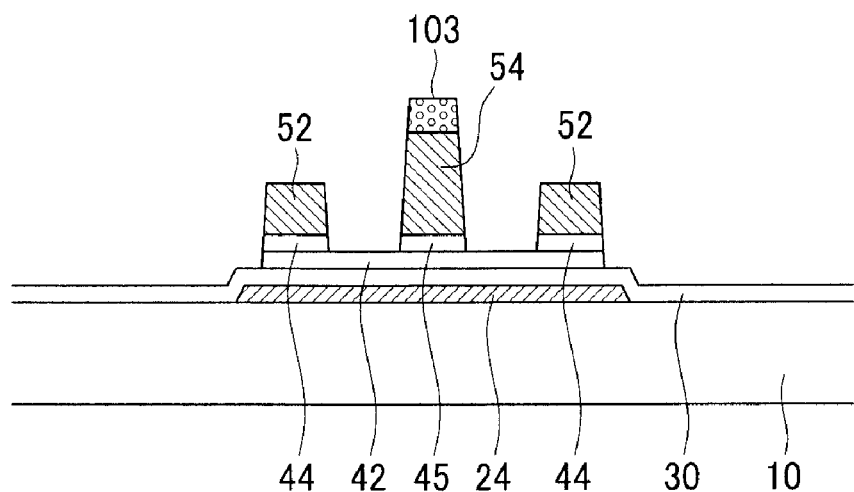
Figure 20:
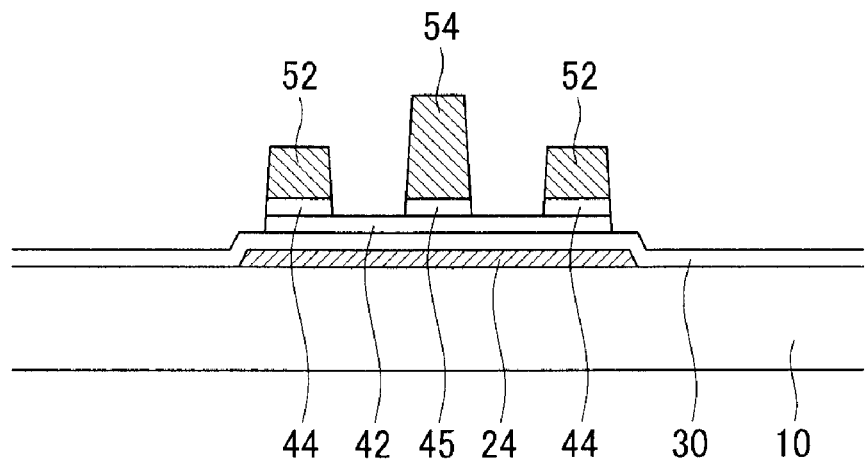

Next, referring to FIG. 18, FIG. 19, and FIG. 20, the photoresist patterns 102 and 103 are etched back to remove the photoresist pattern 102 on the source electrode 52. Accordingly, the source electrode 52 is exposed and etched such that the height of the source electrode 52 is decreased to less than the height of the drain electrode 54. Next, the photoresist pattern 103 is stripped on the drain electrode 54.

Figure 21:
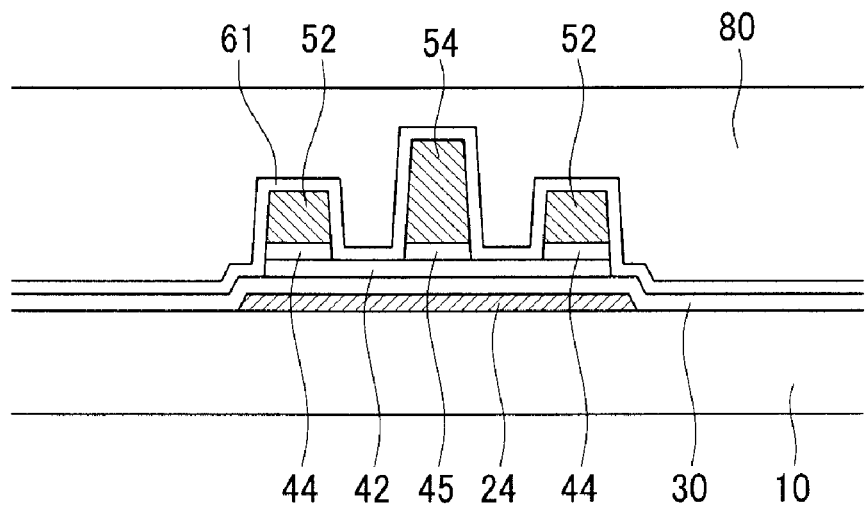

Next, referring to FIG. 21, an insulating material is deposited on the result object of FIG. 20 through plasma-enhanced chemical vapor deposition or chemical vapor deposition, to form passivation layer 61. In addition, flatness layer 80 is formed on the source electrode 52, the drain electrode 54, and the passivation layer 61. Further, a color filter may be formed on the passivation layer 61.

Figure 22:
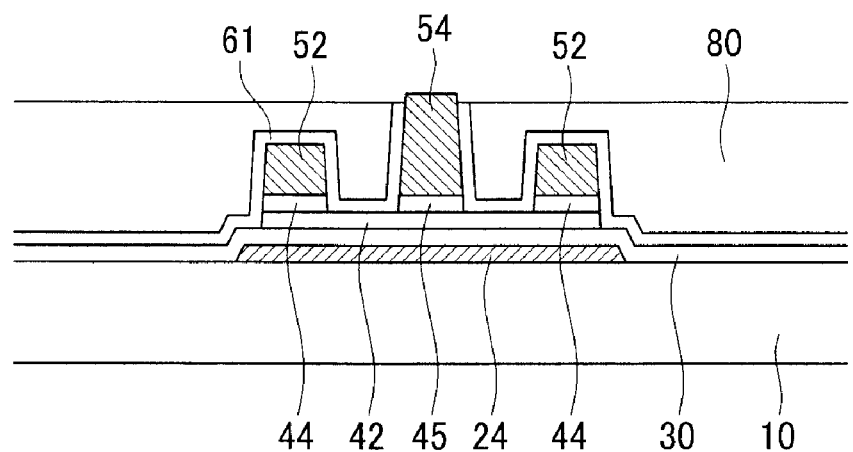

Next, referring to FIG. 22, the flatness layer 80 of FIG. 21 is etched and the passivation layer 61 is etched. Here, differently from the first exemplary embodiment, the height of the source electrode 52 is lower than the height of the drain electrode 54 such that it is not necessary to form the contact hole through partial exposure. The height of the source electrode 52 is low such that the drain electrode 54 may have a higher height than the flatness layer 80 although the flatness layer 80 is etched on the whole surface thereof. The drain electrode 54 may be protruded upward through the flatness layer 80.

Figure 23:
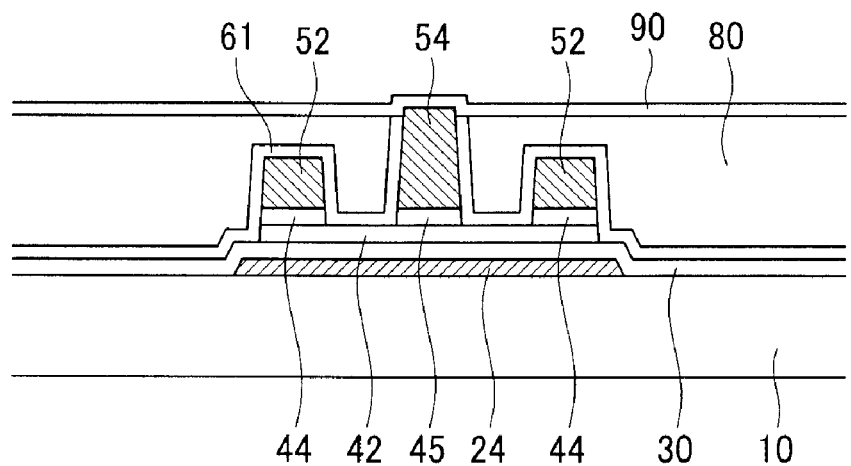
Figure 24:
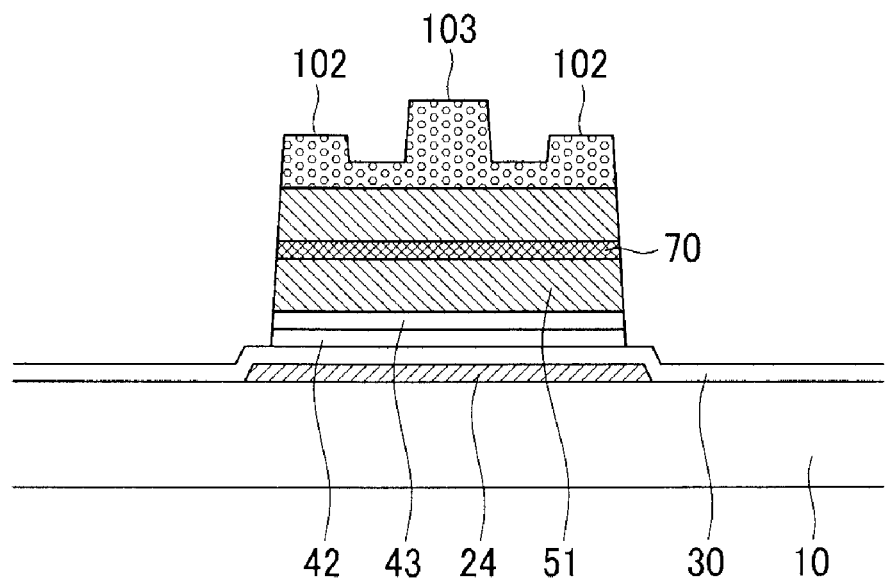
FIG. 24 to FIG. 27 are cross-sectional views sequentially showing a manufacturing method of a thin-film transistor array panel according to a third exemplary embodiment of the present invention.

Next, referring to FIG. 23, a transparent conductive material such as ITO or IZO is sputtered on the flatness layer, and is patterned to form pixel electrode 90 electrically connected to the drain electrode 54. The pattern of pixel electrode 90 is formed in the direction of a plane parallel to the plan view of FIG. 1. Pixel electrode 90 is formed in a rectangularly shaped pattern in FIG. 1, but some embodiments of the present invention may comprise patterns of different shapes.

Next, a manufacturing method of a thin-film transistor array panel according to the third exemplary embodiment of the present invention will be described with reference to FIG. 24 to FIG. 27. For convenience of explanation, in the third exemplary embodiment, members having the same functions as members shown in the drawings of the first exemplary embodiment are indicated by the same reference numerals, and descriptions thereof are omitted or simplified.

Figure 25:
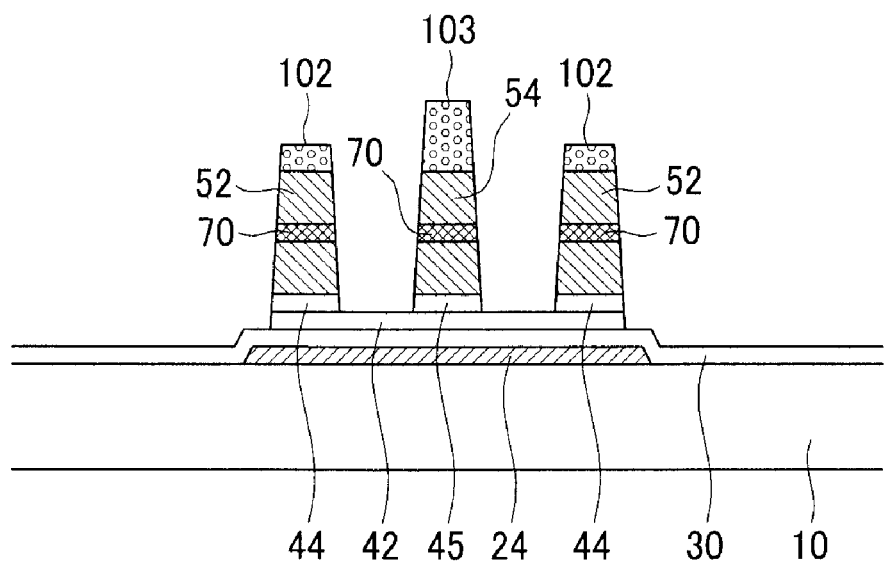
Figure 26:
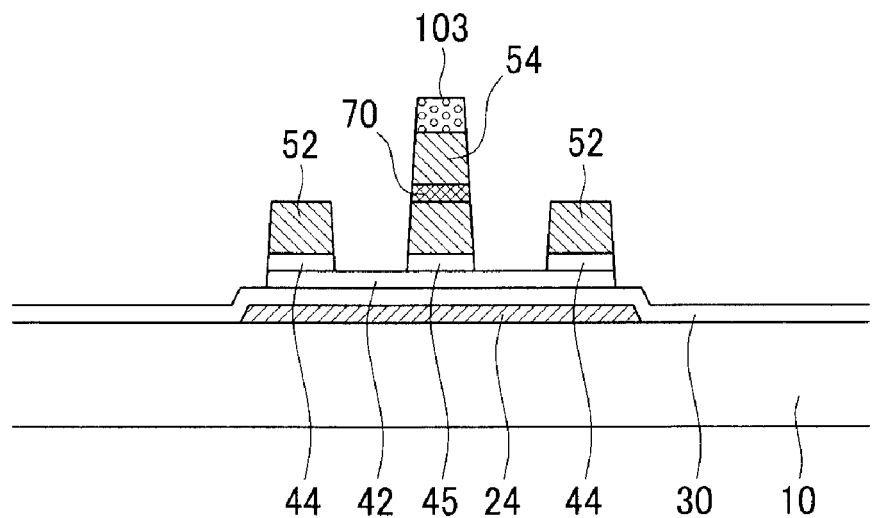
Figure 27:
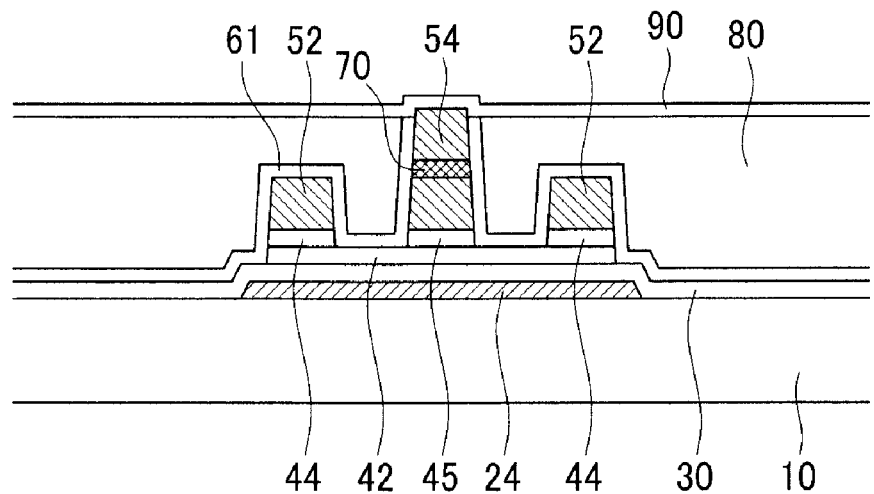

Referring to FIG. 24 to FIG. 27, the present embodiment except for usage of a lifting layer 70 is substantially the same as the second exemplary embodiment. Accordingly, repeated explanations are omitted. The lifting layer 70 is disposed on the middle of the conductive layer 51, and may be made of a metal that does not have an overload for contact with the conductive layer and where a difference of work function for the metal used as the conductive layer 51 is not significant. However, the lifting layer 70 must be a material which is etched by a different etchant from that for the conductive layer 51. For example, when the conductive layer 51 is Cu, the lifting layer 70 may be titanium (Ti). Referring to FIG. 25 and FIG. 26, by using the photoresist pattern 103 as a mask, the drain electrode 54 is maintained, and the lifting layer 70 of the exposed source electrode 52 may be removed. This etching may comprise a wet etching. This lifting removal is based on the fact that the etchants are different for each metal and are applied to selectively remove each metal.

Figure 28:
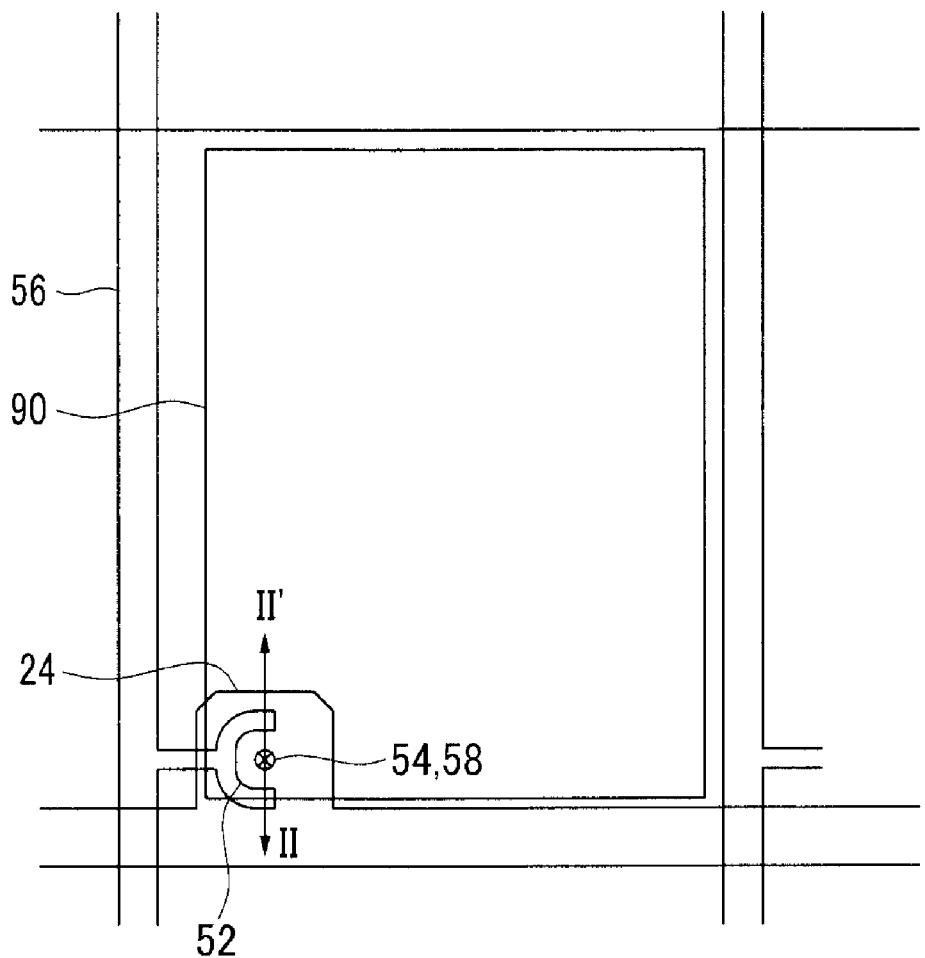
FIG. 28 is a top plan view of an exemplary variation of a thin-film transistor array panel according to the first exemplary embodiment of the present invention.
Figure 29:
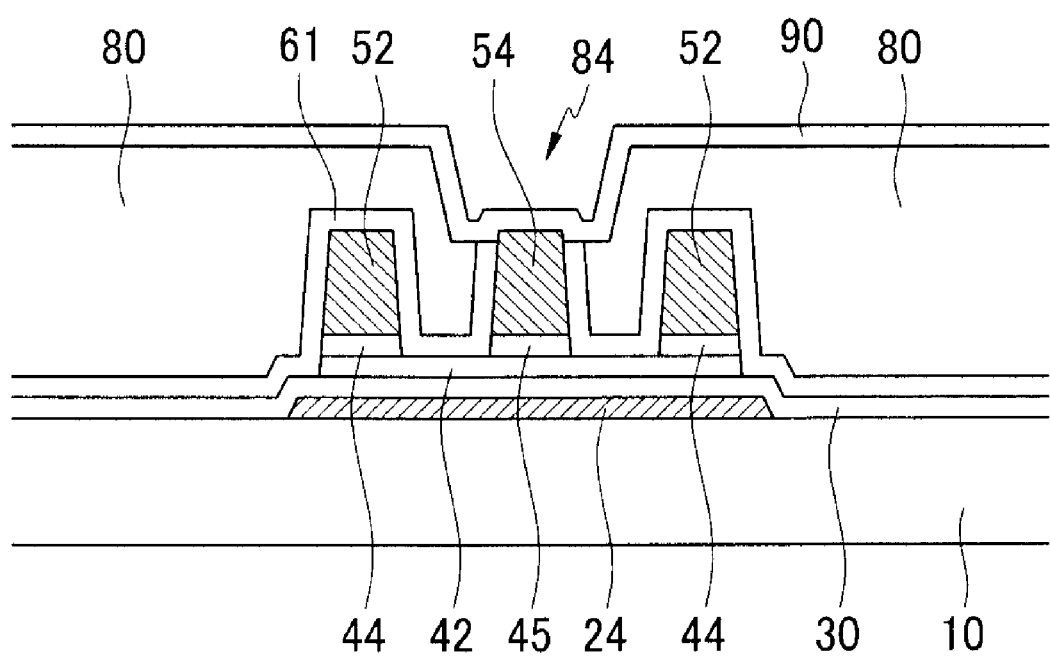
FIG. 29 is a cross-sectional view of an exemplary variation of a thin-film transistor array panel according to the first exemplary embodiment of the present invention taken along the line II-II' shown in FIG. 28.

Next, an exemplary variation of the thin-film transistor array panel according to the first exemplary embodiment of the present invention will be described with reference to FIG. 28 and FIG. 29. FIG. 28 is a top plan view of an exemplary variation of a thin-film transistor array panel, according to the first exemplary embodiment of the present invention. FIG. 29 is a cross-sectional view of an exemplary variation of a thin-film transistor array panel according to the first exemplary embodiment of the present invention taken along the line shown in FIG. 28. For convenience of explanation, in the exemplary variation, members having the same functions as the members shown in the drawings of the first exemplary embodiment are indicated by the same reference numerals, and descriptions thereof are omitted or simplified.

Referring to FIG. 28, a source electrode 55 of the exemplary variation of the first exemplary embodiment of the present invention partially encloses the drain electrode. The manufacturing method of the thin-film transistor array panel according to the exemplary variation of the present invention, except for the source electrode 55 enclosing only a portion of the drain electrode, is substantially the same as the first exemplary embodiment, such that repeated explanations are omitted.

While embodiments of this invention has been described in connection with what is presently considered to be practical exemplary embodiments, it is to be understood that the invention is not limited to the disclosed embodiments. On the contrary, the present disclosure is intended to cover various modifications and equivalent arrangements included within the spirit and scope of the appended claims.

What is claimed is:

1. A thin-film transistor array panel comprising:
    a substrate;
    a gate electrode formed on the substrate;
    a gate insulating layer formed on the gate electrode;
    a source electrode and a drain electrode formed on the gate electrode such that the lowest portions of the source electrode and the drain electrode cover the gate electrode;
    an insulating layer formed on the source electrode; and
    a contact hole formed through the insulating layer exposing a top surface of the drain electrode,
    wherein the insulating layer is made of organic insulating material; and
    wherein the top surface of the drain electrode has a higher height than a top surface of a portion of the insulating layer adjacent to the drain electrode at a bottom surface of the contact hole.

2. The thin-film transistor array panel of claim 1, wherein the source electrode encloses the drain electrode.

3. The thin-film transistor array panel of claim 1, wherein the source electrode partially encloses the drain electrode.

4. The thin-film transistor array panel of claim 1, further comprising:
    a pixel electrode contacting an upper surface of the drain electrode.

5. The thin-film transistor array panel of claim 1, further comprising a passivation layer formed on the source electrode, wherein the insulating layer is formed on the passivation layer.

6. The thin-film transistor array panel of claim 1, wherein at least one of a transverse length and a longitudinal length of the drain electrode is in a range of 2-16 μm.

7. The thin-film transistor array panel of claim 1, wherein the source electrode and the drain electrode have a height of more than 1 μm.

8. The thin-film transistor array panel of claim 1, wherein a height of the source electrode is less than the height of the drain electrode.

9. The thin-film transistor array panel of claim 1, further comprising a color filter formed on the substrate.

10. The thin-film transistor array panel of claim 1, wherein the thin-film transistor array panel forms part of a liquid crystal display device, the liquid crystal display device further comprising:
- a second substrate;
- a liquid crystal layer interposed between the substrate in the thin-film transistor array panel and the second substrate; and
- wherein the second substrate includes an upper panel comprising:
  - a black matrix disposed on the second substrate;
  - an overcoat disposed on the black matrix; and
  - a common electrode disposed on the overcoat.

11. The thin-film transistor array panel of claim 1, wherein the insulating layer is flat except for the portion adjacent to the drain electrode.

* * * * *